United States Patent
Keltcher et al.

(10) Patent No.: US 6,934,903 B1
(45) Date of Patent: Aug. 23, 2005

(54) USING MICROCODE TO CORRECT ECC ERRORS IN A PROCESSOR

(75) Inventors: Chetana N. Keltcher, Sunnyvale, CA (US); William Alexander Hughes, Burlingame, CA (US); Michael T. Clark, Austin, TX (US); Bruce R. Holloway, Boulder Creek, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 521 days.

(21) Appl. No.: 10/023,310

(22) Filed: Dec. 17, 2001

(51) Int. Cl.[7] .................. G11C 29/00; H03M 13/00
(52) U.S. Cl. ..................... 714/763; 714/774
(58) Field of Search ............... 714/763–773, 714/774

(56) References Cited

U.S. PATENT DOCUMENTS

| | | | | |
|---|---|---|---|---|
| 4,995,041 A | * | 2/1991 | Hetherington et al. | 714/763 |
| 5,528,608 A | * | 6/1996 | Shimizume | 714/765 |
| 5,812,564 A | * | 9/1998 | Bonke et al. | 714/769 |
| 5,848,076 A | * | 12/1998 | Yoshimura | 714/763 |
| 5,912,906 A | | 6/1999 | Wu et al. | |
| 5,978,952 A | | 11/1999 | Hayek et al. | |
| 6,101,614 A | | 8/2000 | Gonzales et al. | |
| 6,175,941 B1 | * | 1/2001 | Poeppelman et al. | 714/757 |

* cited by examiner

Primary Examiner—Joseph D. Torres
(74) Attorney, Agent, or Firm—Lawrence J. Merkel; Meyertons, Hood, Kivlin, Kowert & Goetzel, P.C.

(57) ABSTRACT

An apparatus may include an ECC check circuit configured to detect an ECC error in response to an access to first data in a memory and a microcode unit. The microcode unit is coupled to receive an indication that the ECC check circuit has detected the ECC error. In response to the indication, the microcode unit is configured to dispatch a microcode routine stored by the microcode unit. The microcode routine includes instructions which, when executed, correct the ECC error in the memory. In another embodiment, a processor includes the microcode unit and execution circuitry. A method is also contemplated. An access is performed to first data in a memory. An ECC error is detected in response to the access. A microcode routine stored by a microcode unit is dispatched in response to the detecting of the ECC error. The microcode routine includes instructions which, when executed, correct the ECC error in the memory.

43 Claims, 8 Drawing Sheets

| V | Index | Way | Bank | Error Bit | ECC/Data |

| V | Address | Error Bit | ECC/Data |

USING MICROCODE TO CORRECT ECC ERRORS IN A PROCESSOR

BACKGROUND OF THE INVENTION

1. Field of the Invention

This invention is related to the field of processors and computer systems and, more particularly, to error correction code (ECC) mechanisms in processors and computer systems.

2. Description of the Related Art

Modern processors are more frequently being designed to offer reliability features. For example, reliability features are often demanded in large computing systems such as servers. Generally, reliability features reduce the likelihood that erroneous operation of the processor, or software executing thereon, causes erroneous operation of the system as a whole. At the same time, semiconductor fabrication technology improvements continue to shrink the size of the circuits used to form processors. The smaller circuitry, and the more dense packing of circuits made possible by the reduced size, increases the possibility that so-called "soft" errors may be experienced by the processor. Generally, a soft error is an error caused by the occurrence of an event, rather than a defect in the circuitry itself (which produces a "hard" error). Soft errors are intermittent, whereas hard errors occur repeatedly and predictably. Soft errors may occur due to an excessive amount of noise near a circuit, random alpha particles striking the circuit, etc.

Of particular concern for soft errors are various memory arrays, which generally are the most densely packed circuitry within the processor. A soft error may cause one or more bits stored within the memory to change state (e.g. from a binary one to a binary zero, or vice versa). If the changed bits are subsequently accessed, the erroneously changed values may propagate, eventually causing erroneous operation on a larger scale (e.g. reduced reliability of the processor as a whole or reduced reliability of the system including the processor as a whole).

Two popular schemes for protecting against soft errors are parity and error correction code (ECC) schemes. With parity, a single parity bit is stored for a given set of data bits, representing whether the number of binary ones in the data bits is even or odd. The parity is generated when the set of data bits is stored and is checked when the set of data bits is accessed. If the parity doesn't match the accessed set of data bits, then an error is detected. However, with parity, errors cannot be corrected.

ECC schemes assign several ECC bits ("ECC data") per set of data bits in the memory. The ECC bits are encoded from various overlapping combinations of the corresponding data bits. The encodings are selected such that not only can a bit error or errors be detected, but the bit or bits in error may be identifiable so that the error can be corrected (depending on the number of bits in error and the ECC scheme being used). In ECC schemes, there are two types of errors that may be detected (referred to as "ECC errors"herein). A "correctable ECC error" is an ECC error in which the bit or bits in error are identifiable so that a correction may be performed (e.g. by inverting the identified bits). An "uncorrectable ECC error" is an ECC error in which the error is detected but the bits in error are not identifiable and thus the error cannot be corrected. Depending on the number of ECC bits and the corresponding number of data bits, the maximum number of bits which may be in error for a correctable ECC error and the maximum number of bits which may be in error for an uncorrectable ECC error may vary. Generally, the number of bit errors constituting a correctable error is less than the number of bit errors constituting an uncorrectable error for a given ECC scheme. For example, one ECC scheme is the single error correct, multiple error detect (SEC-MED) scheme. In the SEC-MED scheme, a single bit error (per set of data bits and corresponding ECC bits) is a correctable error and multiple bit errors are detectable but uncorrectable errors. Other schemes may be capable of correcting double bit errors and detecting larger numbers of bit errors, etc.

Like parity, the ECC data is generated when the corresponding data bits are stored in a memory. The ECC data is also stored in the memory or another memory provided for storing ECC data, and thus the ECC data itself is subject to possible error. The encoding scheme for the ECC data allows for errors in the data being protected and in the ECC data to be detected (and corrected, if applicable).

Typically, both ECC error detection and correction are implemented in hardware. The hardware typically used to perform ECC correction is provided access to the memory storing the ECC-protected data, so that the corrected data may be written to the memory. Generally, the ECC correction hardware may share a port to the memory with sources of memory accesses. When the ECC correction hardware requires access to correct an error, the other sources are temporarily not able to access the memory. Arbitration circuitry for the port may require some amount of time to select among the access sources and the ECC correction hardware.

SUMMARY OF THE INVENTION

An apparatus may include an ECC check circuit configured to detect an ECC error in response to an access to data in a memory and a microcode unit. The microcode unit is coupled to receive an indication that the ECC check circuit has detected the ECC error. In response to the indication, the microcode unit is configured to dispatch a microcode routine stored by the microcode unit. The microcode routine includes instructions which, when executed, correct the ECC error in the memory.

In another embodiment, a processor includes a microcode unit and execution circuitry. The microcode unit is coupled to receive an indication of an ECC error for data. In response to the indication, the microcode unit is configured to dispatch a microcode routine stored by the microcode unit. The microcode routine includes instructions which, when executed, correct the ECC error. The execution circuitry is coupled to receive the instructions from the microcode unit and is configured to execute the instructions.

A method is also contemplated. An access is performed to data in a memory. An ECC error is detected in response to the access. A microcode routine stored by a microcode unit is dispatched in response to the detecting of the ECC error. The microcode routine includes instructions which, when executed, correct the ECC error in the memory.

BRIEF DESCRIPTION OF THE DRAWINGS

The following detailed description makes reference to the accompanying drawings, which are now briefly described.

Figure 1:
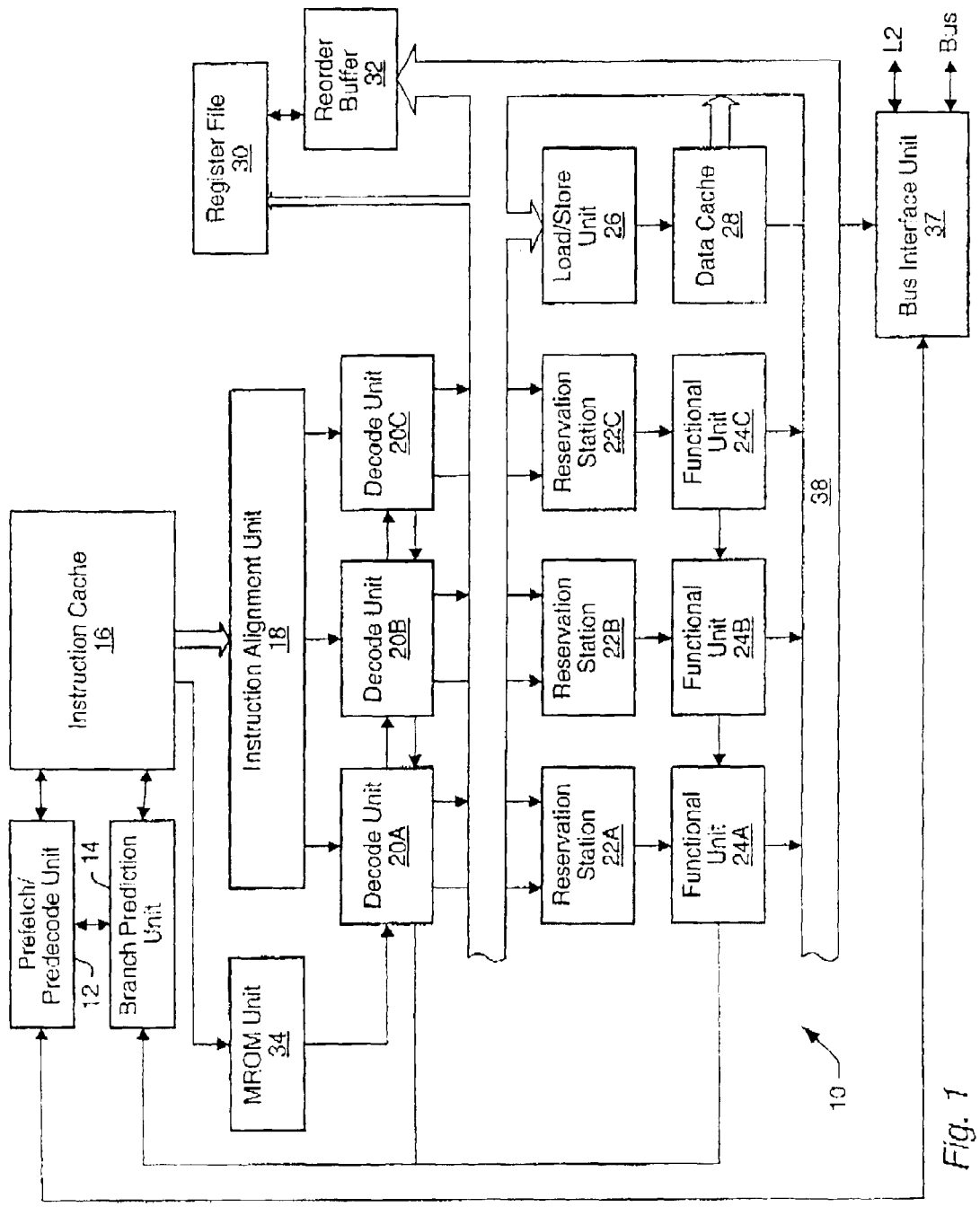
FIG. 1 is a block diagram of one embodiment of a processor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Processor Overview

Turning now to FIG. 1, a block diagram of one embodiment of a processor 10 is shown. Other embodiments are possible and contemplated. As shown in FIG. 1, processor 10 includes a prefetch/predecode unit 12, a branch prediction unit 14, an instruction cache 16, an instruction alignment unit 18, a plurality of decode units 20A–20C, a plurality of reservation stations 22A–22C, a plurality of functional units 24A–24C, a load/store unit 26, a data cache 28, a register file 30, a reorder buffer 32, an MROM unit 34, and a bus interface unit 37. Elements referred to herein with a particular reference number followed by a letter will be collectively referred to by the reference number alone. For example, decode units 20A–20C will be collectively referred to as decode units 20.

Prefetch/predecode unit 12 is coupled to receive instructions from bus interface unit 37, and is further coupled to instruction cache 16 and branch prediction unit 14. Similarly, branch prediction unit 14 is coupled to instruction cache 16. Still further, branch prediction unit 14 is coupled to decode units 20 and functional units 24. Instruction cache 16 is further coupled to MROM unit 34 and instruction alignment unit 18. Instruction alignment unit 18 is in turn coupled to decode units 20. Each decode unit 20A–20C is coupled to load/store unit 26 and to respective reservation stations 22A–22C. Reservation stations 22A–22C are further coupled to respective functional units 24A–24C. Additionally, decode units 20 and reservation stations 22 are coupled to register file 30 and reorder buffer 32. Functional units 24 are coupled to load/store unit 26, register file 30, and reorder buffer 32 as well. Data cache 28 is coupled to load/store unit 26 and to bus interface unit 37. Bus interface unit 37 is further coupled to an L2 interface to an L2 cache and a bus. Finally, MROM unit 34 is coupled to decode units 20.

Instruction cache 16 is a high speed cache memory provided to store instructions. Instructions are fetched from instruction cache 16 and dispatched to decode units 20. In one embodiment, instruction cache 16 is configured to store up to 64 kilobytes of instructions in a 2 way set associative structure having 64 byte lines (a byte comprises 8 binary bits). Alternatively, any other desired configuration and size may be employed. For example, it is noted that instruction cache 16 may be implemented as a fully associative, set associative, or direct mapped configuration.

Instructions are stored into instruction cache 16 by prefetch/predecode unit 12. Instructions may be prefetched prior to the request thereof from instruction cache 16 in accordance with a prefetch scheme. A variety of prefetch schemes may be employed by prefetch/predecode unit 12. As prefetch/predecode unit 12 transfers instructions to instruction cache 16, prefetch/predecode unit 12 may generate predecode data corresponding to the instructions. For example, in one embodiment, prefetch/predecode unit 12 generates three predecode bits for each byte of the instructions: a start bit, an end bit, and a functional bit. The predecode bits form tags indicative of the boundaries of each instruction. The predecode tags may also convey additional information such as whether a given instruction can be decoded directly by decode units 20 or whether the instruction is executed by invoking a microcode procedure controlled by MROM unit 34. Still further, prefetch/predecode unit 12 may be configured to detect branch instructions and to store branch prediction information corresponding to the branch instructions into branch prediction unit 14. Other embodiments may employ any suitable predecode scheme or no predecode, as desired.

One encoding of the predecode tags for an embodiment of processor 10 employing a variable byte length instruction set will next be described. A variable byte length instruction set is an instruction set in which different instructions may occupy differing numbers of bytes. An exemplary variable byte length instruction set employed by one embodiment of processor 10 is the x86 instruction set.

In the exemplary encoding, if a given byte is the first byte of an instruction, the start bit for that byte is set. If the byte is the last byte of an instruction, the end bit for that byte is set. Instructions which may be directly decoded by decode units 20 are referred to as "fast path" instructions. The remaining x86 instructions are referred to as MROM instructions, according to one embodiment. For fast path instructions, the functional bit is set for each prefix byte included in the instruction, and cleared for other bytes. Alternatively, for MROM instructions, the functional bit is cleared for each prefix byte and set for other bytes. The type of instruction may be determined by examining the functional bit corresponding to the end byte. If that functional bit is clear, the instruction is a fast path instruction. Conversely, if that functional bit is set, the instruction is an MROM instruction. The opcode of an instruction may thereby be located within an instruction which may be directly decoded by decode units 20 as the byte associated with the first clear functional bit in the instruction. For example, a fast path instruction including two prefix bytes, a Mod R/M byte, and an immediate byte would have start, end, and functional bits as follows:

Start bits 10000

End bits 00001

Functional bits 11000

MROM instructions are instructions which are determined to be too complex for decode by decode units 20. MROM instructions are executed by invoking MROM unit 34. More specifically, when an MROM instruction is encountered, MROM unit 34 parses and issues the instruction into a subset of defined fast path instructions to effectuate the desired operation. MROM unit 34 dispatches the subset of fast path instructions to decode units 20.

Processor 10 employs branch prediction in order to speculatively fetch instructions subsequent to conditional branch instructions. Branch prediction unit 14 is included to perform branch prediction operations. In one embodiment, branch prediction unit 14 employs a branch target buffer which caches up to two branch target addresses and corresponding taken/not taken predictions per 16 byte portion of a cache line in instruction cache 16. The branch target buffer may, for example, comprise 2048 entries or any other suitable number of entries. Prefetch/predecode unit 12 determines initial branch targets when a particular line is predecoded. Subsequent updates to the branch targets corresponding to a cache line may occur due to the execution of instructions within the cache line. Instruction cache 16 provides an indication of the instruction address being fetched, so that branch prediction unit 14 may determine which branch target addresses to select for forming a branch prediction. Decode units 20 and functional units 24 provide update information to branch prediction unit 14. Decode units 20 detect branch instructions which were not predicted by branch prediction unit 14. Functional units 24 execute the branch instructions and determine if the predicted branch direction is incorrect. The branch direction may be "taken", in which subsequent instructions are fetched from the target address of the branch instruction. Conversely, the branch direction may be "not taken", in which subsequent instructions are fetched from memory locations consecutive to the branch instruction. When a mispredicted branch instruction is detected, instructions subsequent to the mispredicted branch are discarded from the various units of processor 10. In an alternative configuration, branch prediction unit 14 may be coupled to reorder buffer 32 instead of decode units 20 and functional units 24, and may receive branch misprediction information from reorder buffer 32. A variety of suitable branch prediction algorithms may be employed by branch prediction unit 14.

Instructions fetched from instruction cache 16 are conveyed to instruction alignment unit 18. As instructions are fetched from instruction cache 16, the is corresponding predecode data is scanned to provide information to instruction alignment unit 18 (and to MROM unit 34) regarding the instructions being fetched. Instruction alignment unit 18 utilizes the scanning data to align an instruction to each of decode units 20. In one embodiment, instruction alignment unit 18 aligns instructions from three sets of eight instruction bytes to decode units 20. Decode unit 20A receives an instruction which is prior to instructions concurrently received by decode units 20B and 20C (in program order). Similarly, decode unit 20B receives an instruction which is prior to the instruction concurrently received by decode unit 20C in program order. In some embodiments, (e.g. embodiments employing fixed-length instruction sets), the instruction alignment unit 18 may be eliminated.

Decode units 20 are configured to decode instructions received from instruction alignment unit 18. Register operand information is detected and routed to register file 30 and reorder buffer 32. Additionally, if the instructions require one or more memory operations to be performed, decode units 20 dispatch the memory operations to load/store unit 26. Each instruction is decoded into a set of control values for functional units 24, and these control values are dispatched to reservation stations 22 along with operand address information and displacement or immediate data which may be included with the instruction. In one particular embodiment, each instruction is decoded into up to two operations which may be separately executed by functional units 24A–24C.

Processor 10 supports out of order execution, and thus employs reorder buffer 32 to keep track of the original program sequence for register read and write operations, to implement register renaming, to allow for speculative instruction execution and branch misprediction recovery, and to facilitate precise exceptions. A temporary storage location within reorder buffer 32 is reserved upon decode of an instruction that involves the update of a register to thereby store speculative register states. If a branch prediction is incorrect, the results of speculatively-executed instructions along the mispredicted path can be invalidated in the buffer before they are written to register file 30. Similarly, if a particular instruction causes an exception, instructions subsequent to the particular instruction may be discarded. In this manner, exceptions are "precise" (i.e. instructions subsequent to the particular instruction causing the exception are not completed prior to the exception). It is noted that a particular instruction is speculatively executed if it is executed prior to instructions which precede the particular instruction in program order. Preceding instructions may be a branch instruction or an exception-causing instruction, in which case the speculative results may be discarded by reorder buffer 32.

The decoded instructions provided at the outputs of decode units 20 are routed directly to respective reservation stations 22. In one embodiment, each reservation station 22 is capable of holding instruction information (e.g. decoded instructions as well as operand values, operand tags and/or immediate data) for up to six pending instructions awaiting issue to the corresponding functional unit. It is noted that for the embodiment of FIG. 1, each reservation station 22 is associated with a dedicated functional unit 24. Accordingly, three dedicated "issue positions" are formed by reservation stations 22 and functional units 24. In other words, issue position 0 is formed by reservation station 22A and functional unit 24A. Instructions aligned and dispatched to reservation station 22A are executed by functional unit 24A. Similarly, issue position 1 is formed by reservation station 22B and functional unit 24B; and issue position 2 is formed by reservation station 22C and functional unit 24C.

Upon decode of a particular instruction, if a required operand is a register location, register address information is routed to reorder buffer 32 and register file 30 simultaneously. The register file 30 comprises storage locations for each of the architected registers included in the instruction set implemented by the processor 10. Additional storage locations may be included within register file 30 for use by MROM unit 34. Reorder buffer 32 contains temporary storage locations for results which change the contents of these registers to thereby allow out of order execution. A temporary storage location of reorder buffer 32 is reserved for each instruction which, upon decode, is determined to modify the contents of one of the real registers. Therefore, at various points during execution of a particular program, reorder buffer 32 may have one or more locations which contain the speculatively executed contents of a given register. If following decode of a given instruction it is determined that reorder buffer 32 has a previous location or locations assigned to a register used as an operand in the given instruction, the reorder buffer 32 forwards to the corresponding reservation station either: 1) the value in the most recently assigned location, or 2) a tag for the most recently assigned location if the value has not yet been produced by the functional unit that will eventually execute the previous instruction. If reorder buffer 32 has a location reserved for a given register, the operand value (or reorder buffer tag) is provided from reorder buffer 32 rather than from register file 30. If there is no location reserved for a required register in reorder buffer 32, the value is taken directly from register file 30. If the operand corresponds to a memory location, the operand value is provided to the reservation station through load/store unit 26.

In one particular embodiment, reorder buffer 32 is configured to store and manipulate concurrently decoded instructions as a unit. This configuration will be referred to herein as "line-oriented". By manipulating several instructions together, the hardware employed within reorder buffer 32 may be simplified. For example, a line-oriented reorder buffer included in the present embodiment allocates storage sufficient for instruction information pertaining to three instructions (one from each decode unit 20) whenever one or more instructions are dispatched by decode units 20. By contrast, a variable amount of storage is allocated in conventional reorder buffers, dependent upon the number of instructions actually dispatched. A comparatively larger number of logic gates may be required to allocate the variable amount of storage. When each of the concurrently decoded instructions has executed, the instruction results are stored into register file 30 simultaneously. The storage is then free for allocation to another set of concurrently decoded instructions. Additionally, the amount of control logic circuitry employed per instruction is reduced because the control logic is amortized over several concurrently decoded instructions. A reorder buffer tag identifying a particular instruction may be divided into two fields: a line tag and an offset tag. The line tag identifies the set of concurrently decoded instructions including the particular instruction, and the offset tag identifies which instruction within the set corresponds to the particular instruction. It is noted that storing instruction results into register file 30 and freeing the corresponding storage is referred to as "retiring" the instructions. It is further noted that any reorder buffer configuration may be employed in various embodiments of processor 10.

As noted earlier, reservation stations 22 store instructions until the instructions are executed by the corresponding functional unit 24. An instruction is selected for execution if: (i) the operands of the instruction have been provided; and (ii) the operands have not yet been provided for instructions which are within the same reservation station 22A–22C and which are prior to the instruction in program order. It is noted that when an instruction is executed by one of the functional units 24, the result of that instruction is passed directly to any reservation stations 22 that are waiting for that result at the same time the result is passed to update reorder buffer 32 (this technique is commonly referred to as "result forwarding"). An instruction may be selected for execution and passed to a functional unit 24A–24C during the clock cycle that the associated result is forwarded. Reservation stations 22 route the forwarded result to the functional unit 24 in this case. In embodiments in which instructions may be decoded into multiple operations to be executed by functional units 24, the operations may be scheduled separately from each other In one embodiment, each of the functional units 24 is configured to perform integer arithmetic operations of addition and subtraction, as well as shifts, rotates, logical operations, and branch operations. The operations are performed in response to the control values decoded for a particular instruction by decode units 20. It is noted that a floating point unit (not shown) may also be employed to accommodate floating point operations. The floating point unit may be operated as a coprocessor, receiving instructions from MROM unit 34 or reorder buffer 32 and subsequently communicating with reorder buffer 32 to complete the instructions. Additionally, functional units 24 may be configured to perform address generation for load and store memory operations performed by load/store unit 26. In one particular embodiment, each functional unit 24 may comprise an address generation unit for generating addresses and an execute unit for performing the remaining functions. The two units may operate independently upon different instructions or operations during a clock cycle.

Each of the functional units 24 also provides information regarding the execution of conditional branch instructions to the branch prediction unit 14. If a branch prediction was incorrect, branch prediction unit 14 flushes instructions subsequent to the mispredicted branch that have entered the instruction processing pipeline, and causes fetch of the required instructions from instruction cache 16 or main memory. It is noted that in such situations, results of instructions in the original program sequence which occur after the mispredicted branch instruction are discarded, including those which were speculatively executed and temporarily stored in load/store unit 26 and reorder buffer 32. It is further noted that branch execution results may be provided by functional units 24 to reorder buffer 32, which may indicate branch mispredictions to functional units 24.

Results produced by functional units 24 are sent to reorder buffer 32 if a register value is being updated, and to load/store unit 26 if the contents of a memory location are changed. If the result is to be stored in a register, reorder buffer 32 stores the result in the location reserved for the value of the register when the instruction was decoded. A plurality of result buses 38 are included for forwarding of results from functional units 24 and load/store unit 26. Result buses 38 convey the result generated, as well as the reorder buffer tag identifying the instruction being executed.

Load/store unit 26 provides an interface between functional units 24 and data cache 28. In one embodiment, load/store unit 26 is configured with a first load/store buffer having storage locations for data and address information for pending loads or stores which have not accessed data cache 28 and a second load/store buffer having storage locations for data and address information for loads and stores which have accessed data cache 28. For example, the first buffer may comprise 12 locations and the second buffer may comprise 32 locations. Decode units 20 arbitrate for access to the load/store unit 26. When the first buffer is full, a decode unit must wait until load/store unit 26 has room for the pending load or store request information. Load/store unit 26 also performs dependency checking for load memory operations against pending store memory operations to ensure that data coherency is maintained. A memory operation is a transfer of data between processor 10 and the main memory subsystem (although the transfer may be accomplished in the data cache 28). Memory operations may be the result of an instruction which utilizes an operand stored in memory, or may be the result of a load/store instruction which causes the data transfer but no other operation.

Data cache 28 is a high speed cache memory provided to temporarily store data being transferred between load/store unit 26 and the main memory subsystem. In one embodiment, data cache 28 has a capacity of storing up to 64 kilobytes of data in an two way set associative structure. It is understood that data cache 28 may be implemented in a variety of specific memory configurations, including a set associative configuration, a fully associative configuration, a direct-mapped configuration, and any suitable size of any other configuration.

Bus interface unit 37 is configured to communicate between processor 10 and other components in a computer system via a bus. For example, the bus may be compatible with the EV-6 bus developed by Digital Equipment Corporation. Alternatively, any suitable interconnect structure may be used including packet-based, unidirectional or bi-directional links, etc. An optional L2 cache interface may be employed as well for interfacing to a level two cache.

It is noted that, while the embodiment of FIG. 1 is a superscalar implementation, other embodiments may employ scalar implementations. Furthermore, the number of functional units may be varied from embodiment to embodiment. Any execution circuitry for executing fast path and microcode (e.g. MROM) instructions may be used. Other embodiments may use a centralized reservation station rather than the individual reservation stations shown in FIG. 1. Furthermore, other embodiments may employ a central scheduler rather than the reservation stations and reorder buffer shown in FIG. 1.

ECC Mechanism

Figure 2:
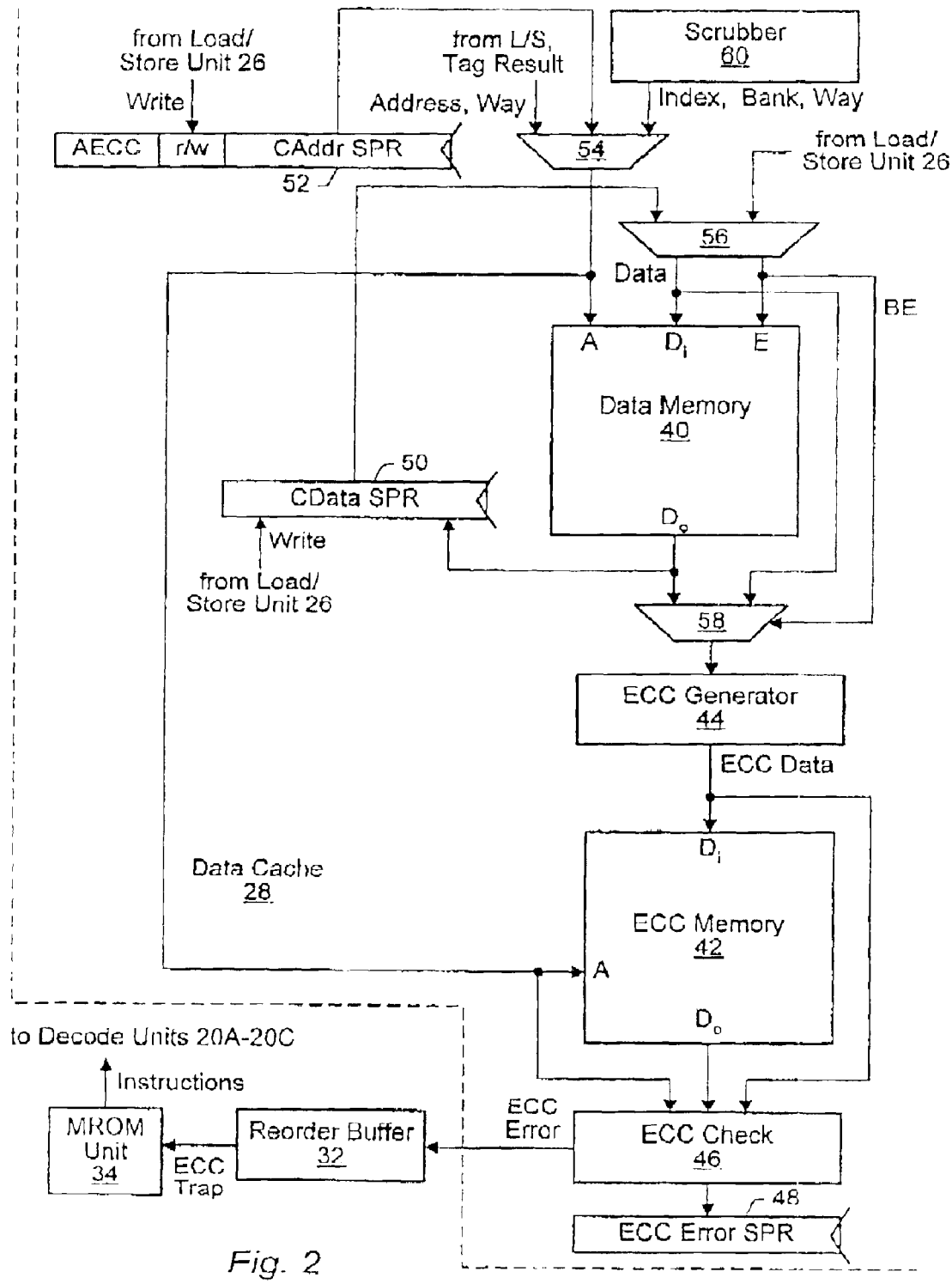
FIG. 2 is a block diagram of one embodiment of a portion of the processor shown in FIG. 1.

Turning now to FIG. 2, a block diagram of a portion of one embodiment of the data cache 28 is shown along with the reorder buffer 32 and the MROM unit 34. Other embodiments are possible and contemplated. In the embodiment of FIG. 2, the data cache 28 is coupled to provide an ECC error indication to the reorder buffer 32, which is coupled to provide an ECC trap indication to the MROM unit 34. The MROM unit 34 is coupled to provide instructions to the decode units 20A–20C. In the illustrated embodiment, the data cache 28 includes a data memory 40, an ECC memory 42, an ECC generator 44, an ECC check circuit 46, an ECC error special purpose register (SPR) 48, a cache address (CAddr) SPR 52, a cache data (CData) SPR 50, an address multiplexor (mux) 54, a data/byte enable mux 56, a data mux 58, and a scrubber 60. The address mux 54 is coupled to receive an address from the load/store unit 26 (and a corresponding way from the data cache tag result), an index, bank, and away from the scrubber 60, an index, bank, and way from the CAddr SPR 52. The output of the address mux 54 is coupled to an address input (A) of the data memory 40 and the ECC memory 42. The data/byte enable mux 56 is coupled to receive data and corresponding byte enables for an access from the load/store unit 26, and is further coupled to receive data and byte enables from the CData SPR 50. The byte enables from the CData SPR 50 may be all enabled (e.g. all set) to cause the data to be written to the data memory 40 and to be supplied through the data mux 58 for ECC generation, if applicable. The byte enables for the CData SPR input may be supplied as a constant to the data/byte enable mux 56 instead of from the CData SPR storage, if desired. The output of the data/byte enable mux 56 is coupled to a data input ($D_i$) of the data memory 40 (for the data portion of the output of the data/byte enable mux 56) and to an enable input (E) of the data memory 40 (for the data portion of the output of the data/byte enable mux 56). The data from the data/byte enable mux 56 is also coupled as an input to the data mux 58, which also receives data from a data output ($D_o$) of the data memory 40. The data mux 58 receives the byte enables output from the data/byte enable mux 56 as a selection control, and has an output coupled to the ECC generator 44. The $D_o$ output of the data memory 40 is also coupled to the CData SPR 50. Selection controls for the muxes 54 and 56 are not shown in FIG. 2, but generally may be controlled to select one of the load/store unit 26, the CAddr and CData SPRs 52 and 50, or the scrubber 60 to use the data cache port comprising the A, E, and $D_i$ inputs and the $D_o$ output. Both the CAddr SPR 52 and CData SPR 50 are coupled to receive writes from the load/store unit 26. The ECC generator 44 is configured to output ECC data to a data input ($D_i$) on the ECC memory 42 and to the ECC check circuit 46. Additionally, the ECC memory 42 includes a data output ($D_o$) coupled to the ECC check circuit 46. The ECC check circuit 46 is coupled to the ECC error SPR 48 and to provide the ECC error indication to the reorder buffer 32. The ECC check circuit 46 is also coupled to receive the address output from the address mux 54 and the way output from the way mux 56 for recording in the ECC error SPR 48, in one embodiment.

Generally, the processor 10 is configured to detect ECC errors in hardware (using the ECC check circuit 46) and employs a microcode routine to correct ECC errors. For the embodiment of FIG. 2, the microcode routine may use the CAddr and CData SPRs 52 and 50 to access the data memory 40 to correct ECC errors in the data stored therein. To correct ECC errors in the ECC data stored in the ECC memory 42, the microcode routine may use the CAddr SPR 52 to read the corresponding data from the data memory 40 and may use the ECC generator 44 to generate correct ECC data for storage in the ECC memory 42. The microcode routine is stored by the MROM unit 34, and is invoked via the ECC trap supplied by the reorder buffer 32, which receives the ECC error indication from the ECC check circuit 46. The MROM unit 34 dispatches the instructions from the microcode routine to the decode units 20A–20C, which may dispatch the instructions for execution by the functional units 24A–24C similar to instructions fetched from the instruction cache 12.

In the illustrated embodiment, the microcode routine uses a separate access path (the SPRs) to access the data cache memory than the path used by the memory operations from the load/store unit 26. In another embodiment, the microcode routine includes load/store instructions to access the data cache memory (and these load/store instructions are executed as memory operations through the load/store unit 26 in a manner similar to other memory operations).

The data cache memory in FIG. 2 includes a data memory 40, which stores the data being cached by the data cache 28, and further includes an ECC memory 42, which stores the ECC data corresponding to the data in the data memory 40. The ECC data may be assigned to the cache data in any suitable fashion. In one embodiment, the data memory 40 is divided into a set of banks, where a cache line of data is stored across the banks and only the bank including the data corresponding to a given access is operated during that access. In such an embodiment, the data within one bank of one cache line is assigned ECC data in the ECC memory 42. In other words, ECC data is calculated on one bank-sized set of data bits. In one particular implementation, a bank may store 64 data bits of a given cache line and 8 ECC bits may be assigned to the 64 data bits.

The data memory 40 includes a port for shared use by load/store memory operations, the scrubber 60, and the SPRs 50 and 52. The port includes the address input (A) (which includes index, bank, and way portions in this embodiment), the data input ($D_i$), the byte enable input (E), and the data output ($D_o$). The ECC memory 42 includes a port for shared use by load/store memory operations, the scrubber 60, and the SPRs 50 and 52. The port includes the address input (A) (which includes index, bank, and way portions in this embodiment), the data input ($D_i$), and the data output ($D_o$).

For the illustrated embodiment, the CAddr and CData SPRs are used by the microcode routine to correct ECC errors. Generally, the microcode routine may include instructions which read and write the SPRs. The CAddr SPR 52 is used to address the data memory 40 and the ECC memory 42, and also may include control bits to cause the accesses to be performed. For example, in the illustrated embodiment, the CAddr SPR 52 includes a read/write (r/w) indication which indicates whether a read or a write of the memory is to be performed on the data memory 40. For example, the r/w indication may include a read bit indicative, when set, that a read is to be performed and a write bit indicative, when set, that a write is to be performed. If both bits are clear, then no operation is to be performed. Alternatively, a single bit may be used as the r/w indication (with one state indicating read and the other state indicating write) and the data cache circuitry may perform one read or write per update of the SPRs by instructions executed in the processor 10. Additionally, the CAddr SPR 52 includes an autoECC (AECC) indication which indicates whether or not to write updated ECC data into the ECC memory 42. For example, the AECC indication may be a bit indicative when set, that the autoECC mechanism is to be used and indicative, when clear, that the autoECC mechanism is not to be used. The above exemplary implementations will be used below, although any indication may be used in other embodiments.

To correct an ECC error in one of the data bits, the microcode routine may write the CAddr SPR 52 with the index, bank, and way of the data memory 42 to be accessed, and may set the read bit in the r/w indication and clear the AECC bit. The corresponding data is output by the data memory 40 on the $D_o$ output and is captured by the CData SPR 50. The microcode routine may then read the CData SPR 50 to obtain the data, invert the data bit(s) in error, and write the corrected data back to the CData SPR 50. The microcode routine may then write the CAddr SPR 52 to set the write bit in the r/w indication, thus causing the data memory 40 to update with the corrected data.

To correct an ECC error in one of the ECC bits, the microcode routine may use the CAddr SPR 52 and the autoECC indication. The microcode routine may write the CAddr SPR 52 with the index, bank, and way of the data memory 42 to be accessed, and may set the read bit in the r/w indication. In response to the read bit, the data memory 40 outputs the corresponding data on the $D_o$ output, and the data is captured in the CData SPR 50. The microcode routine may then write the CAddr SPR 52 to set the write bit in the r/w indication. In response to the byte enables being all set (and selected through the data/byte enable mux 56 along with the data from the CData SPR 50), the mux 58 selects the data from the CData SPR 50. The ECC generator 44 receives the data, and generates ECC data therefore, which the ECC generator 44 passes to the $D_i$ input of the ECC memory 42. The ECC memory 42 receives the address from the CAddr SPR 52 via the A input, and updates the addressed location with the newly-generated (correct) ECC data from the $D_i$ input.

Read accesses for load memory operations are performed by presenting an address on the A input of the data memory 40 and the ECC memory 42. The way to be read (determined from tag comparisons in the tag array, not shown) may be supplied on the A input as well. The data memory 40 outputs the data from the indexed set, way, and bank on the $D_o$ output. The data passes through the data mux 58 and corresponding ECC data is generated by the ECC generator 44, which provides the ECC data to the ECC check circuit 46. The ECC memory 42 outputs the ECC data from the indexed set and way on its $D_o$ output to the ECC check circuit 46. The ECC check circuit 46 checks the generated ECC data and the stored ECC data to determine if an ECC error has occurred.

If the ECC check circuit 46 detects an ECC error, the ECC check circuit 46 transmits an indication to the reorder buffer 32. For example, the indication may be a signal, asserted to indicate that the error has occurred. The reorder buffer 32 associates the ECC error with the instruction corresponding to the load memory operation. In one embodiment, the load/store unit 26 supplies the reorder buffer tag corresponding to the load memory operation to the reorder buffer 32 when the load memory operation is selected to access the data cache 28. The reorder buffer 32 may associate the ECC error with the instruction based on the number of pipeline stages in the data cache 32 (if any). Alternatively, the reorder buffer tag may proceed through the data cache 28 to the ECC check circuit 46, which may supply the reorder buffer tag to the reorder buffer 32.

Additionally, the ECC check circuit 46 logs the ECC error in the ECC error SPR 48 for access by the microcode routine. The ECC check circuit 46 may log an indication of the location in the memory of the ECC error. For example, the ECC check circuit 46 may log the address presented on the address input, or may log the index, bank, and way of the error, depending on the embodiment. Additionally, a valid bit may be used to indicate whether or not the ECC error SPR 48 is storing valid information. The bit location in error within the data or the ECC data may be logged, as well as an indication of whether the error is in the data or in the ECC data.

In one embodiment, the ECC check circuit 46 may also log ECC errors in a second register (e.g. a machine check register). Uncorrectable ECC errors may be fatal, and the machine check register may store the address of the error and the type of error for software inspection. Additionally, the logging of errors in this manner may be used for performance monitoring/error monitoring purposes by software.

When the instruction for which the ECC error is detected is ready to retire, the reorder buffer 32 may signal the ECC trap to the MROM unit 34. The ECC trap indication may include a trap address within the ROM employed by the MROM unit 34, at which the microcode routine for correcting ECC errors is stored. Instructions subsequent to the instruction for which the ECC error is detected may be purged. In other words, the trap to microcode is an exception on the instruction for which the ECC error is detected. In response to the ECC trap, the MROM unit 34 dispatches instructions from the microcode routine for correcting ECC errors to the decode units 20A–20C.

Write accesses for store memory operations are performed similarly, except that the data to be written is provided on the $D_i$ input to the data memory 40 and the byte enables indicating which bytes within the cache line (or bank, in one embodiment) are to be updated are supplied on the E input to the data memory 40 (both the data and byte enables may be provided through the data/byte enable mux 56). The data memory 40 reads the data in the indexed set and way (and bank) and provides the data on the $D_o$ output, and updates the data in the indexed set and way with data from the $D_i$ input responsive to the byte enables. For example, the data memory 40 may read the data during the first phase of a clock cycle and may update the data during the second phase. The data prior to the write is merged with the write data via the data mux 58, under control of the byte enables, and the merged data is passed to the ECC generator 44. The generated ECC data is provided on the $D_i$ input of the ECC memory 42, which also receives the address and way on the A input. The ECC memory 42 updates the indexed set, way, and bank with the newly generated ECC data.

In one embodiment, the ECC generator 44 may also generate ECC data from the unmodified data for write accesses, and may provide the ECC data to the ECC check circuit 46. In this manner, ECC errors existing in the data being updated by the store may be detected. In such an embodiment, the ECC check circuit 46 may be configured to ignore the ECC error if the write is overwriting the bit or bits in error, since the error is moot.

In the illustrated embodiment, a scrubber 60 shares the port to the data memory 40 and ECC memory 42 with the load/store unit 26 and the SPRs 50 and 52, using the address mux 54. Other embodiments may use a separate port, or may include the scrubber in the load/store unit 26. The scrubber 60 is optional, and may not be included in some embodiments. Additionally, other embodiments are contemplated in which the SPRs 50 and 52 have a separate port on the data memory 40 and ECC memory 42 than the load/store unit 26 and the scrubber 60.

The scrubber 60 may be used to periodically read various locations in the data memory 40 to check for ECC errors. The scrubber 60 may generally read sequentially through each location during idle cycles from the load/store unit 26 (using index, way, and bank values). The scrubber 60 may use the port on cycles that the load/store unit 26 is idle and the SPRs 50 and 52 are idle. The scrubber 60 may thus cause a read of the next location in sequence from the data memory 40 and the ECC memory 42. If the read results in an ECC error, the microcode routine may be used to correct the ECC error. In this case, there is no instruction to associate the ECC error with. The reorder buffer 32 may be configured to assign the ECC error to the oldest instruction represented therein in such a case. Alternatively, the reorder buffer 32 may associate the ECC error with the youngest instruction or any other instruction, as desired.

The MROM unit 34 may be an example of a microcode unit. Generally, a microcode unit includes a nonvolatile memory, such as a read-only memory (ROM), which stores various microcode routines (including the microcode routine for correcting ECC errors, in this case). Additionally, a microcode unit includes circuitry for dispatching microcode routines responsive to traps signaled by other circuitry within the processor 10. A microcode routine is a set of one or more instructions arranged to perform a predefined function, when executed.

In the present embodiment, a set associative data cache 28 has been used as an example. Thus, a location in the cache is identified by an index (a portion of the address of an access which selects one or more storage locations in the cache which are eligible to store the corresponding data) and a way (which selects one storage location from a set, for set associative caches). In direct-mapped embodiments, only one cache storage location is selected via the index and thus the way is not used. Additionally, in embodiments in which the memory is implemented in multiple banks, one or more address bits are used to select a bank. In other embodiments, the data cache 28 may not be banked.

In one embodiment, the data cache 28 illustrated in FIG. 2 may be pipelined. For example, the read of the data memory 40 may occur in a first pipeline stage, the generation of ECC data by the ECC generator 44 may occur in a second pipeline stage, the update or read of ECC data from the ECC memory 42 may occur in a third pipeline stage, and the ECC check circuit 46 may operate in a fourth pipeline stage. Other embodiments may use more or fewer pipeline stages, or no pipelining, as desired. Alternatively, the ECC memory read may be performed in the same pipeline stage as the data memory read, if desired. It is noted that, while the illustrated embodiment includes separate data memory and ECC memory, other embodiments may integrate the data memory and ECC memory.

It is noted that, while the present embodiment supports out-of-order execution using the reorder buffer 32, other embodiments may employ in-order execution. In such embodiments, the ECC check circuit 46 may signal the microcode unit directly.

It is noted that any type of special purpose register may be used for embodiments in which the microcode routine accesses the cache memory through SPRs. Generally, a special purpose register is any register which is not addressable by typical ALU instructions. Generally, specific instructions defined to access the SPRs are used. In one embodiment, the SPRs may be model specific registers accessed using the WRMSR and RDMSR instructions of the x86 instruction set. It is noted that, while the load/store unit 26 handles reads and writes to the SPRs shown in FIG. 2, other embodiments may perform the reads and writes of the SPRs in one or more functional units.

It is noted that, while the illustrated embodiment shows one port of the cache memory for use by the load/store unit 26, other embodiments may employ multiple ports for concurrent use by the load/store unit 26. Similarly, while one ECC error SPR 48 is shown in the present embodiment, other embodiments may employ two or more ECC error SPRs 48 to form a queue of ECC errors. The microcode routine may be configured to correct as many errors as are queued when invoked, or may be invoked separately for each error.

It is noted that, while the above embodiment employs the autoECC mechanism for generating corrected ECC data, other embodiments may couple the CData SPR or a similar SPR to the ECC memory 42. In such embodiments, ECC data may be directly read and written by the microcode routine.

It is noted that, while the present embodiment illustrates the use of a microcode routine to correct ECC errors in the data cache 28, other embodiments may use a similar mechanism to correct errors in any memory (e.g. a register file). Similarly, other levels of caching may implement ECC error correction in microcode (e.g. an L2 cache, external to the processor or integrated into the processor).

Figure 3:
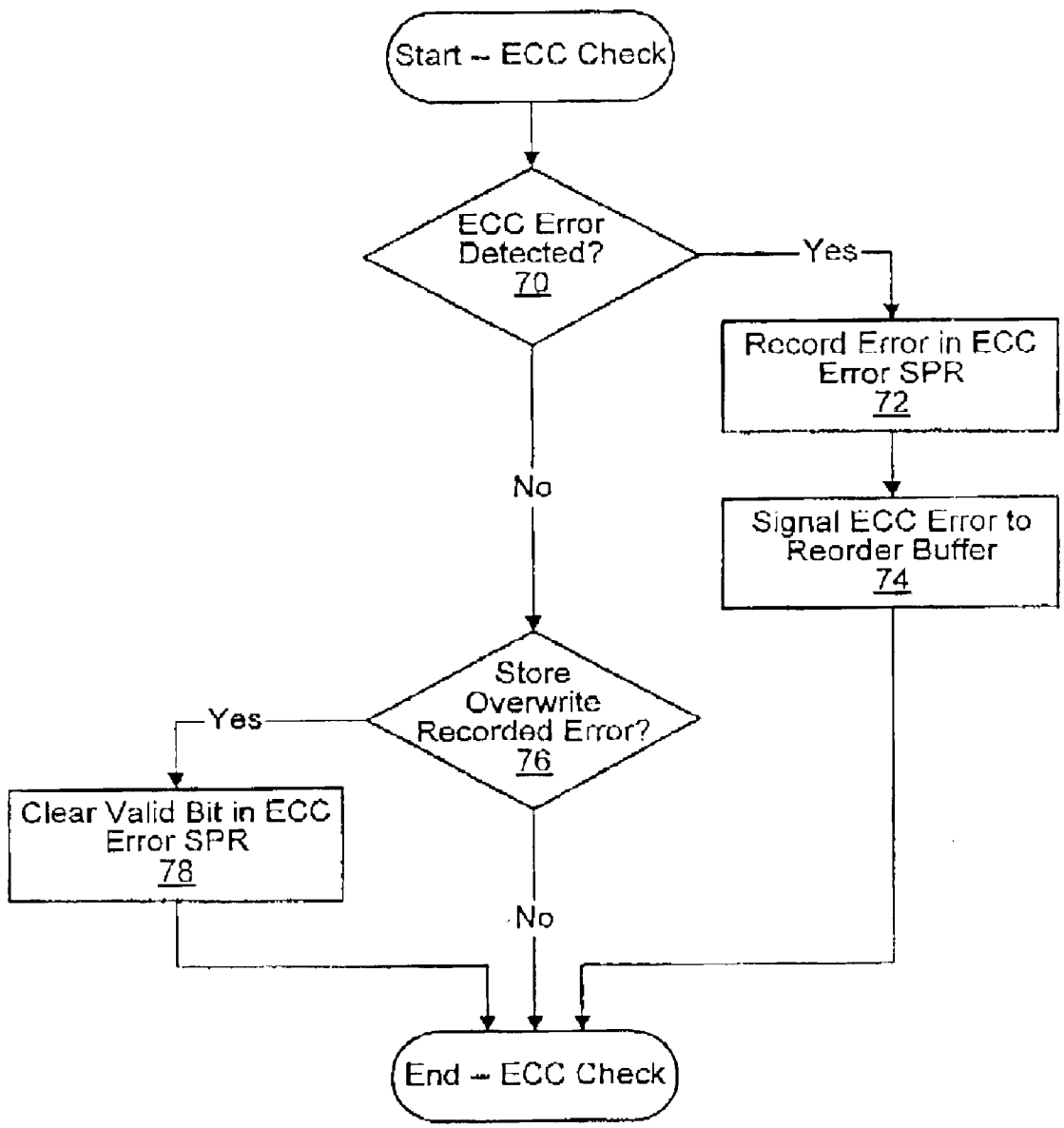
FIG. 3 is a flowchart illustrating operation of one embodiment of an ECC check circuit shown in FIG. 2.

Turning now to FIG. 3, a flowchart is shown illustrating operation of one embodiment of the ECC check circuit 46 shown in FIG. 2. Other embodiments are possible and contemplated. The blocks shown in FIG. 3 are illustrated in a particular order for ease of understanding. Other orders may be used. Furthermore, blocks may be performed in parallel in combinatorial logic circuitry forming the ECC check circuit 46. For example, the decision blocks 70 and 76 are independent and may be performed in either order or in parallel. The blocks 72 and 74 may be performed in either order or in parallel. Generally, the blocks shown in FIG. 3 represent operation of circuitry employed by the ECC check circuit 46.

Figure 6:
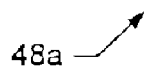
FIG. 6 is a block diagram illustrating one embodiment of a contents of an ECC error MSR.
Figure 7:
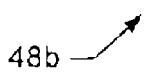
FIG. 7 is a block diagram illustrating a second embodiment of a contents of an ECC error MSR.

If the ECC check circuit 46 detects an ECC error for an access (decision block 70), the ECC error check circuit 46 records the error in the ECC error SPR 48 (block 72). Depending on the embodiment, various information may be recorded. Generally, the information includes one or more values which locate the error in the data memory 40 and/or the ECC memory 42. The values may be the address of the access, or may be the values used to access the memory (e.g. index, way, and/or bank). Additionally, the information may include a value or values identifying the bit or bits in error, a valid indication (e.g. a valid bit) indicating whether or not the ECC error SPR 48 is storing ECC error information, and an indication of whether the error is in the data stored in the data memory 40 or the ECC data stored in the ECC memory 42. Two exemplary embodiments of the ECC error SPR 48 are shown in FIGS. 6 and 7.

Additionally, if the ECC check circuit 46 detects an ECC error for an access, the ECC error check circuit 46 signals the ECC error to the reorder buffer 32 (block 74). The signaling may include at least one signal indicating the detection of an ECC error. The signaling may also include the reorder buffer tag, as mentioned above. The signaling may further include an indication of whether the ECC error is a correctable or uncorrectable error.

In the illustrated embodiment, the ECC check circuit 46 detects an ECC error by comparing the stored ECC data corresponding to the accessed data (from the ECC memory 42) with the ECC data generated from the accessed data provided by the data memory 40 (generated by the ECC generator 44). If the stored ECC data miscompares with the generated ECC data, the ECC check circuit 46 may use the stored ECC data and the generated ECC data to determine which bit or bits is in error (based on the encoding scheme used to generate the ECC data).

The ECC error check circuit 46 also checks, for write accesses done in response to a store memory operation, whether or not the store overwrites bits which were previously recorded in the ECC error SPR 48 (decision block 76). If the store overwrites the error bits, then no correction is needed. The ECC check circuit 46 clears the valid bit in the ECC error SPR 48 (block 78). The microcode routine may check the valid bit if the ECC error SPR 48 before attempting to correct the error, and may inhibit the correction if the valid bit is clear.

Figure 4:
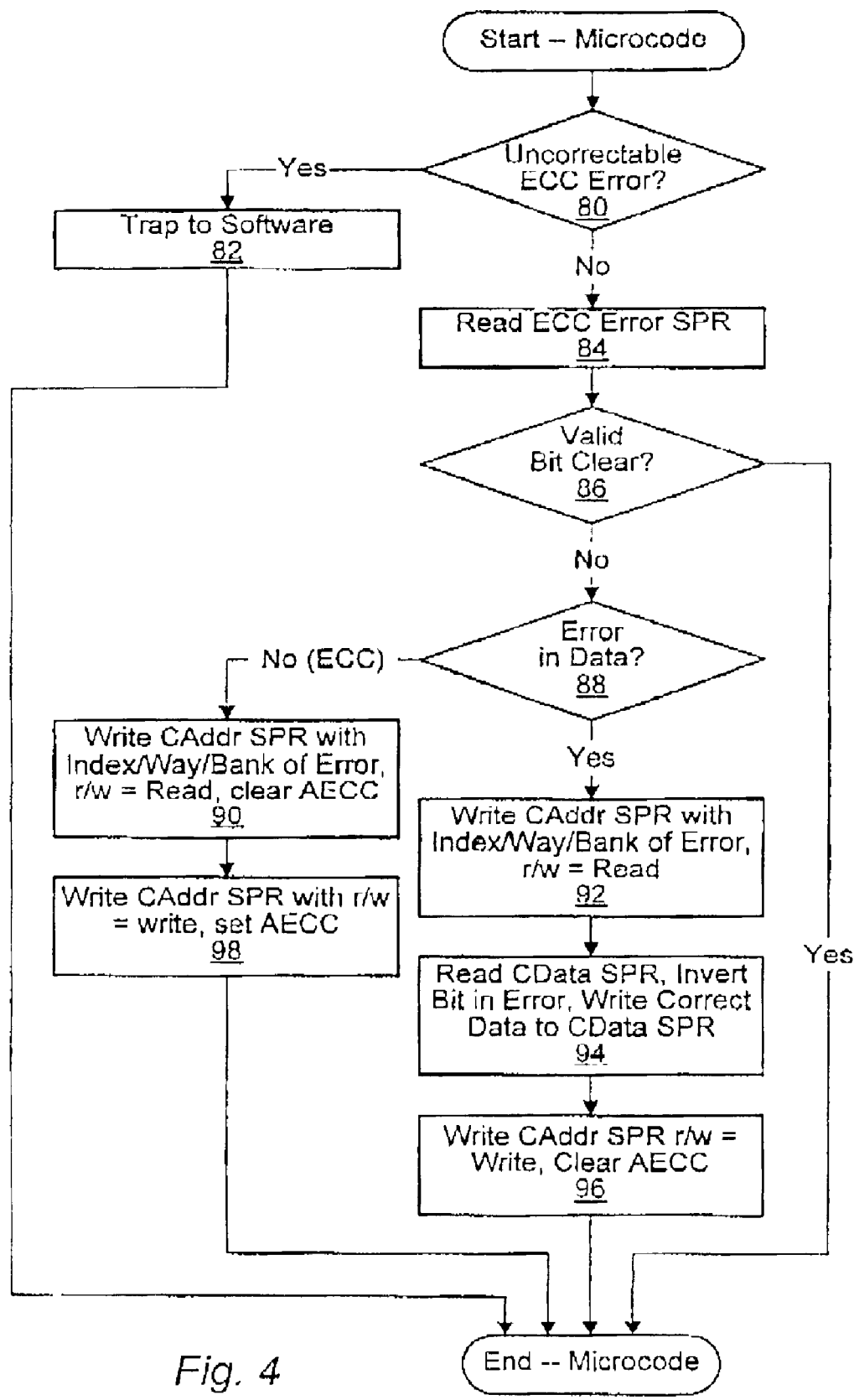
FIG. 4 is a flowchart illustrating one embodiment of a microcode routine for ECC error correction.

Turning next to FIG. 4, a flowchart illustrating a first embodiment of a microcode routine for correcting ECC errors is shown. Other embodiments are possible and contemplated. The embodiment shown in FIG. 4 is an embodiment which uses the CAddr and CData SPRs 52 and 50 (and the autoECC generation, if applicable) to correct the ECC error. The blocks shown in FIG. 4 are illustrated in a particular order for ease of understanding. Other orders may be used. Generally, the blocks shown in FIG. 4 illustrate one or more instructions which, when executed (e.g. by functional units 24 and/or load/store unit 26) perform the functions illustrated in those blocks.

The microcode routine may determine whether the error is a correctable or uncorrectable ECC error (decision block 80). The type of error may be recorded in the reorder buffer 32, or may be recorded in an SPR such as the ECC error SPR 48. If the error is an uncorrectable ECC error, the microcode routine may trap to software (e.g. an operating system routine) to handle the error (block 82). It is noted that, in some embodiments, a separate microcode routine may be invoked by the reorder buffer 32 to handle uncorrectable ECC errors (or the reorder buffer 32 may trap to software directly via a predefined exception), in which case the blocks 80 and 82 may be eliminated.

The microcode routine reads the ECC error SPR 48 to obtain the information used to to correct the error (block 84). The microcode routine checks the valid bit from the ECC error SPR 48 to ensure that the error is still to be corrected (e.g. has not been overwritten by a subsequent store) (decision block 86). If the valid bit is clear, the microcode routine exits without performing the error correction.

If the valid bit is still set, the microcode routine checks the ECC/Data indication from the ECC error SPR 48 to determine if the error is in the data or in the ECC data (decision block 88). If the error is in the ECC data, the microcode routine writes the CAddr SPR 52 with the index, way, and bank of the location in error (from the ECC error SPR 48), sets the r/w indication to indicate read, and clears the AECC bit (block 90). In response, the data from the data memory 40 is captured in the CData SPR 50. The microcode routine writes the CAddr SPR 50 with the r/w indication to indicate write, and sets the AECC bit (block 98). The index, way and bank may remain from the previous write or may be written again, as desired. In response, the data from the CData SPR 50 may be passed to the ECC generator 44, which generates correct ECC data for storage in the ECC memory 42.

On the other hand, if the error is in the data from the data memory 40, the microcode routine may write the CAddr SPR 52 with the index, way, and bank of the location in error and set the r/w indication to indicate read (block 92). In response, the data memory 40 outputs the data, which is captured by the CData SPR 50. The microcode routine reads the data from the CData SPR 50 (e.g. into a microcode temporary register), inverts the bit in error (thus correcting the error), and writes the corrected data back to the CData SPR 50 (block 94). The microcode routine may write the CAddr SPR 52 with the r/w indication set to write and may clear the AECC bit (block 96). The address information (index/row/bank) may still be stored in the CAddr SPR 52, or may be written again by the microcode routine. In response, the data memory 40 updates with the corrected data from the CData SPR 50.

As an alternative to decision block 88 and blocks 90, 92, 94, 96, and 98 shown in FIG. 4, the microcode routine may be configured to write the CAddr SPR 52 (as illustrated in blocks 90 and 92), read the CData SPR 50, selectively invert the bit in error dependent on whether the ECC error is in the data or the ECC data, write the data back to the CData SPR 50, and write the CAddr SPR with the AECC bit set (as illustrated in block 98). In such an embodiment, the ECC data is written in cases that the error is in the data (not the ECC data), but is written with correct ECC data (i.e. the same data that is already stored in the ECC memory) and thus the ECC data write is a don't care.

Generally, the reading and writing the ECC error, CAddr, and CData SPRs for the flowchart shown in FIG. 4 may be accomplished using SPR read and write instructions. Other operations may be accomplished using various arithmetic/logic instructions specified in the instruction set implemented by the processor 10 or special microcode instructions defined in addition to the instruction set, as desired.

Figure 5:
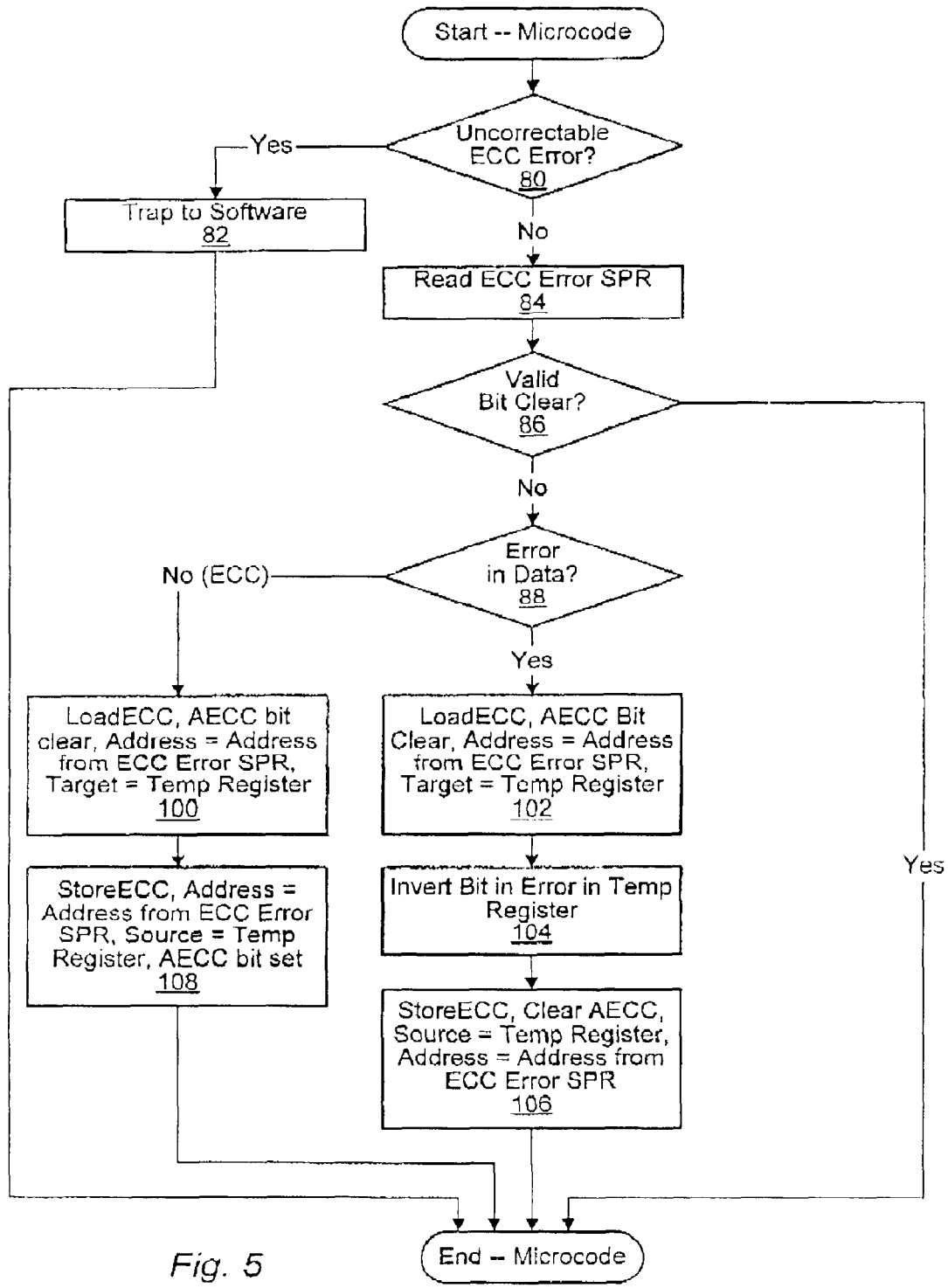
FIG. 5 is a flowchart illustrating a second embodiment of a microcode routine for ECC error correction.

Turning now to FIG. 5, a flowchart illustrating a second embodiment of a microcode routine for correcting ECC errors is shown. Other embodiments are possible and contemplated. The embodiment shown in FIG. 5 is an embodiment which uses load/store instructions (executed by the load/store unit 26) to correct the ECC error (and thus the CAddr and CData SPRs may not be needed for this embodiment). The blocks shown in FIG. 5 are illustrated in a particular order for ease of understanding. Other orders may be used. Generally, the blocks shown in FIG. 5 illustrate one or more instructions which, when executed (e.g. by functional units 24 and/or load/store unit 26) perform the functions illustrated in those blocks.

Similar to the embodiment of FIG. 4, the microcode routine may optionally determine if the error is correctable or uncorrectable (and trap to software), and may read the ECC error SPR 48, check the valid bit, and exit without correcting the error if the valid bit is clear (blocks 80, 82, 84, and 86). Additionally, the microcode routine may determine if the error is in the ECC data or the data in the data memory 40 (decision block 88).

In the embodiment of FIG. 5, the microcode routine includes load and store instructions for accessing the data cache 28 to correct the ECC error. Particularly, in one embodiment, the load and store instructions may be instructions defined for use by the MROM unit 34, and may be coded differently than the load/store instructions defined in the instruction set implemented by processor 10. For example, the loadECC and storeECC instructions may be interpreted by the load/store unit 26 and the data cache 28 as not requiring an ECC check, and may disable the ECC check circuit 46 for accesses performed in response to these instructions. Alternatively, the architected load/store instructions may be used and the microcode routine may disable ECC checking (e.g. by writing a configuration register used to enable/disable ECC checking). In one embodiment, the processor 10 may treat loadECC and storeECC instructions as serializing instructions, if desired.

In embodiments including the autoECC generation, the loadECC and storeECC instructions may also include an operand (e.g. an immediate operand or a register operand) indicating whether or not the autoECC generation is to be used for the access performed in response to the instruction. This operand is referred to in FIG. 5 as the AECC bit, which may be set to cause the autoECC generation to be used and clear to cause the autoECC generation not to be used. Other embodiments may include direct access to the ECC memory 42 by the loadECC and storeECC instructions.

The embodiment of FIG. 5 assumes that the address of the access for which the ECC error was detected is stored in the ECC error SPR 48. For example, an embodiment of the ECC error SPR 48 similar to FIG. 7 may be used.

If the error is in the ECC data, the microcode routine may use a loadECC instruction with AECC operand bit clear (block 100). The address operand(s) of the loadECC instruction are set to generate the address from the ECC error SPR 48 (e.g. the address may have been loaded into a temporary register of the register file 30, which may be reserved for used by microcode routines. The temporary register may be used as the address operand of the instruction.) The target of the loadECC instruction may be a temporary register. The data corresponding to the ECC data in error is thus loaded into the temporary register. The microcode routine may include a storeECC instruction with the AECC operand bit set, and the same address operand(s) as the loadECC instruction (block 108). The source of the storeECC instruction may be the temporary register that was the target of the loadECC instruction. In response to the storeECC, the data is supplied to the ECC generator 44, which generates the corrected ECC data for storage in the ECC memory 42.

On the other hand, if the error is in the data in data memory 40, the microcode routine may use a loadECC instruction with the AECC operand bit clear (block 102). The address operand(s) of the loadECC instruction are set to generate the address from the ECC error SPR 48 (similar to the above discussion for block 100). Additionally, the target register of the loadECC instruction (in which the data is to be stored) may be a temporary register. The microcode routine inverts the bit in error in the temporary register (block 104). The microcode routine then uses a storeECC instruction with the AECC operand bit clear, address operand(s) to generate the address from the ECC error SPR 48, and the temporary register storing the corrected data as a source register (block 106). In this manner, the corrected data is written back to the data memory 40.

As an alternative to decision block 88 and blocks 100, 102, 104, 106, and 108 shown in FIG. 5, the microcode routine may be configured to perform the loadECC instruction (as set forth in either of blocks 100 or 102), followed by selectively inverting the bit in error dependent on whether the ECC error is in the data or the ECC data, followed by performing the storeECC instruction with the AECC bit set. In such an embodiment, the ECC data is written in cases that the error is in the data (not the ECC data), but is written with correct ECC data (i.e. the same data that is already stored in the ECC memory) and thus the ECC data write is a don't care. Additionally, in such embodiments, the AECC operand may be eliminated and the ECC data may be written for all storeECC instructions and not written for loadECC instructions.

It is noted that, while the flowcharts of FIGS. 4 and 5 may imply correcting a single bit error, other embodiments may be capable of correcting multiple bit errors. In such embodiments, the inverting of two or more bits may be performed. Additionally, both the ECC data and the data in the data memory 40 may require correction in such embodiments. If so, the microcode routine may perform both the "yes" and "no" legs of the decision block 88 in such cases. Also, the ECC error SPR 48 may be expanded to store indications of the multiple errors.

Turning next to FIG. 6, a block diagram of one embodiment of the ECC error SPR 48 (ECC error SPR 48a) is shown. Other embodiments are possible and contemplated. In the embodiment of FIG. 6, the ECC error SPR 48a includes a valid field (V), an index field, a way field, a bank field, an error bit field, and an ECC/Data field. The valid field (V) stores a valid indication indicative of whether or not the ECC error SPR 48a is storing valid information corresponding to an ECC error. For example, the above description has referred to a valid bit indicative, when set, of validity and indicative, when clear, of invalidity. Other embodiments may use other encodings for the valid indication.

The index, way, and bank fields store the index, way, and bank of the data memory 40 in which the error is detected, respectively. The error bit field stores the location of the error bit within the data (e.g. a bit number). The ECC/Data indication indicates whether the error is in the data or the ECC data. For example, the ECC/Data indication may be a bit indicative, when set, that the error is in the ECC data and indicative, when clear, that the error is in the data. Other encodings may be used for the ECC/Data indication. Alternatively, a single error bit field may be used to identify both ECC data and data errors. For example, if 64 bits of data are covered by 8 bits of ECC data, the error bit field may store numbers between 0 and 71, wherein 0 through 63 are bits 0 through 63 of the data and 64 through 71 are bits 0 through 7 of the ECC data.

FIG. 7 is a block diagram of a second embodiment of the ECC error SPR 48 (ECC error SPR 48b). Other embodiments are possible and contemplated. The embodiment of FIG. 7 includes a valid field (V), an error bit field and an ECC/Data field, similar to the embodiment of FIG. 6. The embodiment of FIG. 7 further includes an address field, which stores the address of the access for which the ECC error was detected.

Computer Systems

Figure 8:
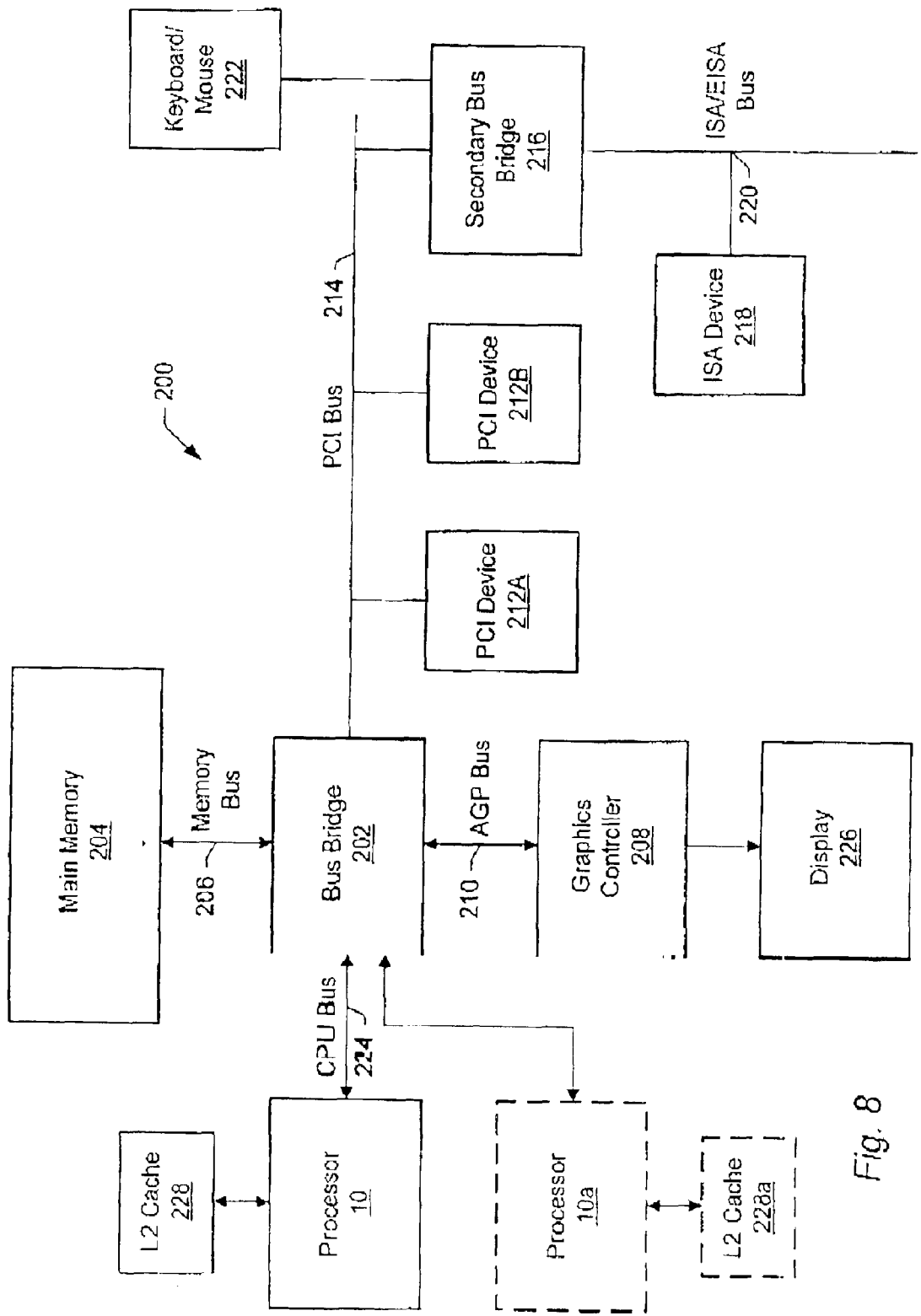
FIG. 8 is a block diagram of one embodiment of a computer system including the processor shown in FIG. 1.

Turning now to FIG. 8, a block diagram of one embodiment of a computer system 200 including processor 10 coupled to a variety of system components through a bus bridge 202 is shown. Other embodiments are possible and contemplated. In the depicted system, a main memory 204 is coupled to bus bridge 202 through a memory bus 206, and a graphics controller 208 is coupled to bus bridge 202 through an AGP bus 210. Finally, a plurality of PCI devices 212A–212B are coupled to bus bridge 202 through a PCI bus 214. A secondary bus bridge 216 may further be provided to accommodate an electrical interface to one or more EISA or ISA devices 218 through an EISA/ISA bus 220. Processor 10 is coupled to bus bridge 202 through a CPU bus 224 and to an optional L2 cache 228. Together, CPU bus 224 and the interface to L2 cache 228 may comprise an external interface to which external interface unit 18 may couple.

Bus bridge 202 provides an interface between processor 10, main memory 204, graphics controller 208, and devices attached to PCI bus 214. When an operation is received from one of the devices connected to bus bridge 202, bus bridge 202 identifies the target of the operation (e.g. a particular device or, in the case of PCI bus 214, that the target is on PCI bus 214). Bus bridge 202 routes the operation to the targeted device. Bus bridge 202 generally translates an operation from the protocol used by the source device or bus to the protocol used by the target device or bus.

In addition to providing an interface to an ISA/EISA bus for PCI bus 214, secondary bus bridge 216 may further incorporate additional functionality, as desired. An input/output controller (not shown), either external from or integrated with secondary bus bridge 216, may also be included within computer system 200 to provide operational support for a keyboard and mouse 222 and for various serial and parallel ports, as desired. An external cache unit (not shown) may further be coupled to CPU bus 224 between processor 10 and bus bridge 202 in other embodiments. Alternatively, the external cache may be coupled to bus bridge 202 and cache control logic for the external cache may be integrated into bus bridge 202. L2 cache 228 is further shown in a backside configuration to processor 10. It is noted that L2 cache 228 may be separate from processor 10, integrated into a cartridge (e.g. slot 1 or slot A) with processor 10, or even integrated onto a semiconductor substrate with processor 10. L2 cache 228 may be protected by ECC data, and ECC errors in the L2 cache 228 may be corrected using a microcode routine (as described above) or in hardware, as desired.

Main memory 204 is a memory in which application programs are stored and from which processor 10 primarily executes. A suitable main memory 204 comprises DRAM (Dynamic Random Access Memory). For example, a plurality of banks of SDRAM (Synchronous DRAM) or Rambus DRAM (RDRAM) may be suitable.

PCI devices 212A–212B are illustrative of a variety of peripheral devices. The peripheral devices may include devices for communicating with another computer system to which the devices may be coupled (e.g. network interface cards, modems, etc.). Additionally, peripheral devices may include other devices, such as, for example, video accelerators, audio cards, hard or floppy disk drives or drive controllers, SCSI (Small Computer Systems Interface) adapters and telephony cards. Similarly, ISA device 218 is illustrative of various types of peripheral devices, such as a modem, a sound card, and a variety of data acquisition cards such as GPEB or field bus interface cards.

Graphics controller 208 is provided to control the rendering of text and images on a display 226. Graphics controller 208 may embody a typical graphics accelerator generally known in the art to render three-dimensional data structures which can be effectively shifted into and from main memory 204. Graphics controller 208 may therefore be a master of AGP bus 210 in that it can request and receive access to a target interface within bus bridge 202 to thereby obtain access to main memory 204. A dedicated graphics bus accommodates rapid retrieval of data from main memory 204. For certain operations, graphics controller 208 may further be configured to generate PCI protocol transactions on AGP bus 210. The AGP interface of bus bridge 202 may thus include functionality to support both AGP protocol transactions as well as PCI protocol target and initiator transactions. Display 226 is any electronic display upon which an image or text can be presented. A suitable display 226 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 200 may be a multiprocessing computer system including additional processors (e.g. processor 10a shown as an optional component of computer system 200). Processor 10a may be similar to processor 10. More particularly, processor 10a may be an identical copy of processor 10. Processor 10a may be connected to bus bridge 202 via an independent bus (as shown in FIG. 8) or may share CPU bus 224 with processor 10. Furthermore, processor 10a may be coupled to an optional L2 cache 228a similar to L2 cache 228.

Figure 9:
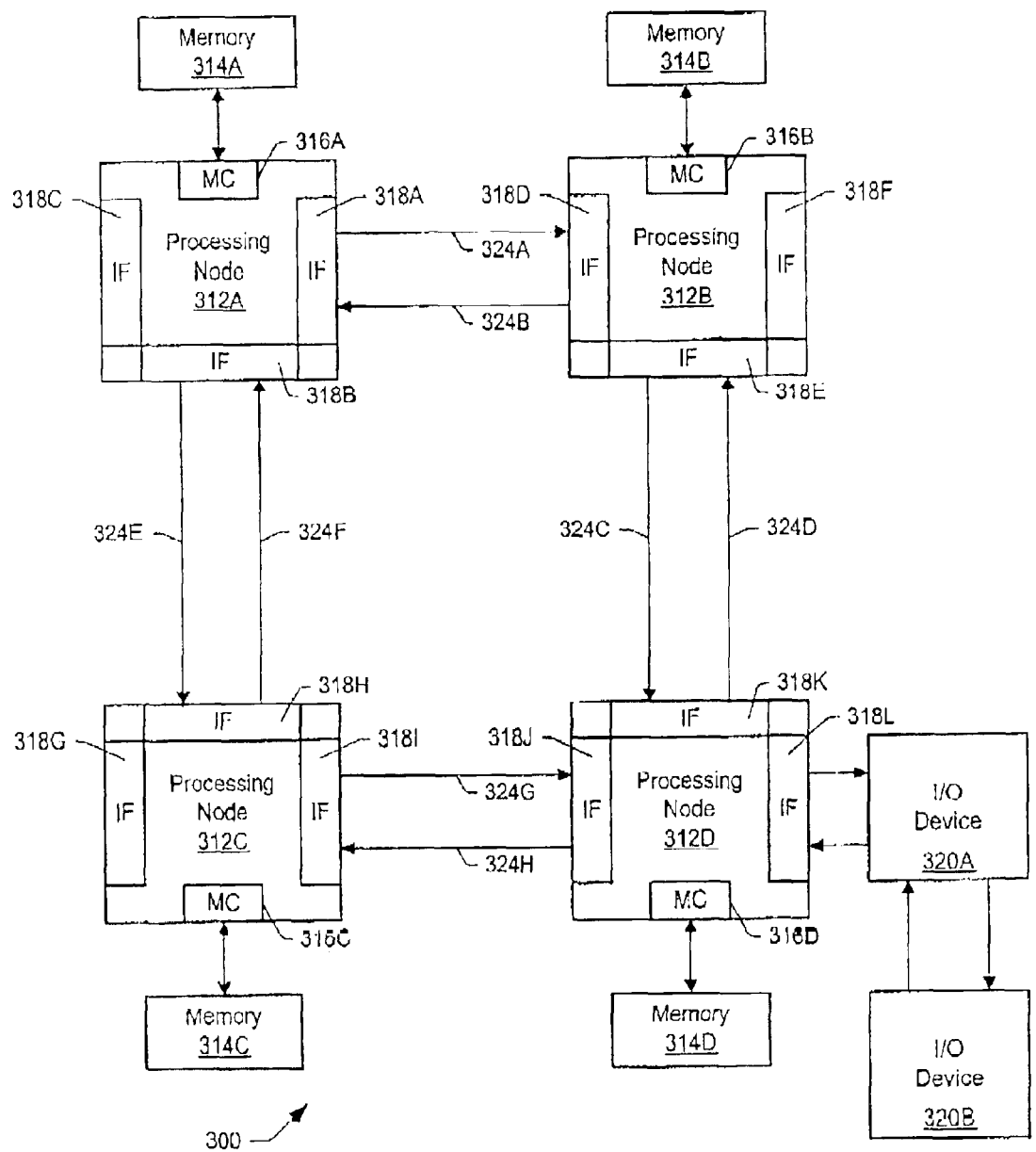
FIG. 9 is a block diagram of a second embodiment of a computer system including the processor shown in FIG. 1.

Turning now to FIG. 9, another embodiment of a computer system 300 is shown. Other embodiments are possible and contemplated. In the embodiment of FIG. 9, computer system 300 includes several processing nodes 312A, 312B, 312C, and 312D. Each processing node is coupled to a respective memory 314A–314D via a memory ear controller 316A–316D included within each respective processing node 312A–312D. Additionally, processing nodes 312A–312D include interface logic used to communicate between the processing nodes 312A–312D. For example, processing node 312A includes interface logic 318A for communicating with processing node 312B, interface logic 318B for communicating with processing node 312C, and a third interface logic 318C for communicating with yet another processing node (not shown). Similarly, processing node 312B includes interface logic 318D, 318E, and 318F; processing node 312C includes interface logic 318G, 318H, and 318I; and processing node 312D includes interface logic 318J, 318K, and 318L. Processing node 312D is coupled to communicate with a plurality of input/output devices (e.g. devices 320A–320B in a daisy chain configuration) via interface logic 318L. Other processing nodes may communicate with other I/O devices in a similar fashion.

Processing nodes 312A–312D implement a packet-based link for inter-processing node communication. In the present embodiment, the link is implemented as sets of unidirectional lines (e.g. lines 324A are used to transmit packets from processing node 312A to processing node 312B and lines 324B are used to transmit packets from processing node 312B to processing node 312A). Other sets of lines 324C–324H are used to transmit packets between other processing nodes as illustrated in FIG. 9. Generally, each set of lines 324 may include one or more data lines, one or more clock lines corresponding to the data lines, and one or more control lines indicating the type of packet being conveyed. The link may be operated in a cache coherent fashion for communication between processing nodes or in a noncoherent fashion for communication between a processing node and an I/O device (or a bus bridge to an I/O bus of conventional construction such as the PCI bus or ISA bus). Furthermore, the link may be operated in a non-coherent fashion using a daisy-chain structure between I/O devices as shown. It is noted that a packet to be transmitted from one processing node to another may pass through one or more intermediate nodes. For example, a packet transmitted by processing node 312A to processing node 312D may pass through either processing node 312B or processing node 312C as shown in FIG. 9. Any suitable routing algorithm may be used. Other embodiments of computer system 300 may include more or fewer processing nodes then the embodiment shown in FIG. 9.

Generally, the packets may be transmitted as one or more bit times on the lines 324 between nodes. A bit time may be the rising or falling edge of the clock signal on the corresponding clock lines. The packets may include command packets for initiating transactions, probe packets for maintaining cache coherency, and response packets from responding to probes and commands.

Processing nodes 312A–312D, in addition to a memory controller and interface logic, may include one or more processors. Broadly speaking, a processing node comprises at least one processor and may optionally include a memory controller for communicating with a memory and other logic as desired. More particularly, each processing node 312A–312D may comprise one or more copies of processor 10. External interface unit 18 may includes the interface logic 318 within the node, as well as the memory controller 316.

Memories 314A–314D may comprise any suitable memory devices. For example, a memory 314A–314D may comprise one or more RAMBUS DRAMs (RDRAMs), synchronous DRAMs (SDRAMs), static RAM, etc. The address space of computer system 300 is divided among memories 314A–314D. Each processing node 312A–312D may include a memory map used to determine which addresses are mapped to which memories 314A–314D, and hence to which processing node 312A–312D a memory request for a particular address should be routed. In one embodiment, the coherency point for an address within computer system 300 is the memory controller 316A–316D coupled to the memory storing bytes corresponding to the address. In other words, the memory controller 316A–316D is responsible for ensuring that each memory access to the corresponding memory 314A–314D occurs in a cache coherent fashion. Memory controllers 316A–316D may comprise control circuitry for interfacing to memories 314A–314D. Additionally, memory controllers 316A–316D may include request queues for queuing memory requests.

Generally, interface logic 318A–318L may comprise a variety of buffers for receiving packets from the link and for buffering packets to be transmitted upon the link. Computer system 300 may employ any suitable flow control mechanism for transmitting packets. For example, in one embodiment, each interface logic 318 stores a count of the number of each type of buffer within the receiver at the other end of the link to which that interface logic is connected. The interface logic does not transmit a packet unless the receiving interface logic has a free buffer to store the packet. As a receiving buffer is freed by routing a packet onward, the receiving interface logic transmits a message to the sending interface logic to indicate that the buffer has been freed. Such a mechanism may be referred to as a "coupon-based" system.

I/O devices 320A–320B may be any suitable I/O devices. For example, I/O devices 320A–320B may include devices for communicate with another computer system to which the devices may be coupled (e.g. network interface cards or modems). Furthermore, I/O devices 320A–320B may include video accelerators, audio cards, hard or floppy disk drives or drive controllers, SCSI (Small Computer Systems Interface) adapters and telephony cards, sound cards, and a variety of data acquisition cards such as GPIB or field bus interface cards. It is noted that the term "I/O device" and the tern "peripheral device" are intended to be synonymous herein.

Numerous variations and modifications will become apparent to those skilled in the art once the above disclosure is fully appreciated. It is intended that the following claims be interpreted to embrace all such variations and modifications.

What is claimed is:

1. An apparatus comprising:
   execution circuitry configured to execute a first instruction which causes an access to first data in a memory;
   an error correction code (ECC) check circuit configured to detect an ECC error in response to the access to the first data in the memory; and
   a microcode unit coupled to receive an indication that the ECC check circuit has detected the ECC error, wherein the microcode unit, in response to the indication, is configured to dispatch a microcode routine stored by the microcode unit, wherein the microcode routine includes instructions which, when executed, correct the ECC error in the memory;
   wherein the microcode unit is coupled to the execution circuitry and the execution circuitry is further configured to execute the instructions in the microcode routine.

2. The apparatus as recited in claim 1 wherein the ECC check circuit is coupled to receive first ECC data and second ECC data, and wherein the ECC check circuit is configured to detect the ECC error responsive to the first ECC data and the second ECC data, and wherein the first ECC data is generated from the first data in response to storing the first data in the memory, wherein the first ECC data is read in response to the access, and wherein the second ECC data is generated from the first data in response to the access.

3. The apparatus as recited in claim 2 further comprising an ECC generator coupled to the ECC check circuit and coupled to receive the first data in response to the access, wherein the ECC generator is configured to generate the second ECC data.

4. The apparatus as recited in claim 3 further comprising a second memory coupled to the ECC check circuit and to receive an address of the access, wherein the second memory is configured to output the first ECC data in response to the address.

5. The apparatus as recited in claim 4 wherein the ECC generator is configured to generate third ECC data in response to the instructions in the microcode routine, and wherein the ECC generator is coupled to the second memory, and wherein the second memory is configured to store the third ECC data.

6. The apparatus as recited in claim 1 further comprising a register coupled to the ECC check circuit, wherein the register is configured to record the ECC error.

7. The apparatus as recited in claim 6 wherein the register is configured to store an indication of the location of the ECC error in the memory.

8. The apparatus as recited in claim 7 wherein the indication of the location comprises the address in the memory.

9. The apparatus as recited in claim 7 wherein the memory comprises a cache, and wherein the indication of the location comprises an index into the cache.

10. The apparatus as recited in claim 9 wherein the cache is set associative, and wherein the indication of the location further comprises a way in the cache.

11. The apparatus as recited in claim 9 wherein the cache comprises two or more banks, and wherein the indication of the location further comprises a bank in the cache.

12. The apparatus as recited in claim 6 wherein the register is further configured to store an indication of a bit in error within the first data.

13. The apparatus as recited in claim 6 wherein the register is further configured to store an indication of whether the error is in the first data or in ECC data corresponding to the first data.

14. The apparatus as recited in claim 6 wherein the microcode routine includes instructions to read the register to identify the ECC error for correction.

15. The apparatus as recited in claim 6 wherein the register includes a valid indication indicative of whether or not the ECC error is valid in the register.

16. The apparatus as recited in claim 15 wherein the ECC check circuit is configured to detect a subsequent write to the first data, and wherein the ECC check circuit is configured, if the subsequent write overwrites the ECC error in the first data, to change the valid indication to a state indicating invalid.

17. The apparatus as recited in claim 16 wherein the microcode routine includes instructions to check the valid indication in the register, and wherein, if the valid indication indicates invalid, the microcode routine is configured to exit without correcting the ECC error.

18. The apparatus as recited in claim 1 wherein the microcode routine includes instructions to read the first data from the memory, to invert a bit in the first data which is indicated as being in error, and to write the first data back to the memory.

19. The apparatus as recited in claim 18 further comprising one or more special purpose registers coupled to the memory for providing access to the memory separate from a read/write access path to the memory, and wherein the microcode routine includes instructions to read and write the special purpose registers to correct the ECC error in the memory.

20. The apparatus as recited in claim 18 wherein the microcode routine includes load and store instructions for reading and writing the memory to correct the ECC error.

21. The apparatus as recited in claim 1 wherein the ECC check circuit is configured to inhibit signaling the ECC error if the access is a write which overwrites the ECC error in the memory.

22. The apparatus as recited in claim 1 wherein the microcode routine, if the ECC error is uncorrectable, is configured to trap to software.

23. A processor comprising:
a microcode unit coupled to receive an indication of an error correction code (ECC) error for first data, wherein the microcode unit, in response to the indication, is configured to dispatch a microcode routine stored by the microcode unit, wherein the microcode routine includes instructions which, when executed, correct the ECC error; and
execution circuitry coupled to receive the instructions from the microcode unit, wherein the execution circuitry is configured to execute the instructions, and wherein the execution circuitry is also configured to execute a first instruction that causes an access to the first data in the memory, wherein the ECC error is detected during the access.

24. The processor as recited in claim 23 further comprising a register configured to record the ECC error.

25. The processor as recited in claim 24 wherein the microcode routine includes instructions to read the register to identify the ECC error for correction.

26. The processor as recited in claim 25 wherein the register includes a valid indication indicative of whether or not the ECC error is valid in the register.

27. The processor as recited in claim 26 wherein, if the subsequent write overwrites the ECC error in the first data, the valid indication is changed to a state indicating invalid.

28. The processor as recited in claim 27 wherein the microcode routine includes instructions to check the valid indication in the register, and wherein, if the valid indication indicates invalid, the microcode routine is configured to exit without correcting the ECC error.

29. The processor as recited in claim 23 wherein the microcode routine includes instructions to read the first data, to invert a bit in the first data which is indicated as being in error, and to write the first data back.

30. The processor as recited in claim 29 further comprising one or more special purpose registers for providing access to the first data, and wherein the microcode routine includes instructions to read and write the special purpose registers to correct the ECC error.

31. The processor as recited in claim 29 wherein the microcode routine includes load and store instructions for correcting the ECC error.

32. The processor as recited in claim 23 wherein the microcode routine, if the ECC error is uncorrectable, is configured to trap to software.

33. The processor as recited in claim 23 further comprising a reorder buffer coupled to receive a second indication indicating the ECC error, and wherein the reorder buffer is configured to generate the indication to the microcode unit responsive to retiring the first instruction.

34. The processor as recited in claim 23 further comprising a cache coupled to the execution circuitry, wherein the cache is configured to store first data and corresponding ECC data, the cache configured to detect an ECC error responsive to an access to the first data in the cache.

35. The processor as recited in claim 23 further comprising an instruction cache, wherein the first instruction is fetched from the instruction cache for execution by the execution circuitry.

36. A computer system comprising the processor as recited in claim 23 and a peripheral device configured to communicate between the computer system and another computer system.

37. The computer system as recited in claim 36 wherein the peripheral device comprises a modem.

38. The computer system as recited in claim 36 wherein the peripheral device comprises a network interface circuit.

39. The computer system as recited in claim 36 further comprising an audio device.

40. A method comprising:
performing an access to first data in a memory in response to executing a first instruction in execution circuitry;
detecting an ECC error in response to the access; and
dispatching a microcode routine stored by a microcode unit in response to the detecting, wherein the microcode routine includes instructions which, when executed in the execution circuitry, correct the ECC error in the memory.

41. The method as recited in claim 40 further comprising:
recording the ECC error in a register;
detecting a write to the first data subsequent to detecting the ECC error, wherein the write overwrites the ECC error in the first data; and
invalidating the ECC error in the register responsive to detecting the write.

42. The method as recited in claim 41 wherein the microcode routine includes instructions which, when executed, exit without correcting the error if the ECC error in the register has been invalidated.

43. The method as recited in claim 40 further comprising trapping from the microcode routine to software if the ECC error is uncorrectable.

* * * * *